(12) United States Patent
Fujimoto

(10) Patent No.: US 7,619,233 B2
(45) Date of Patent: Nov. 17, 2009

(54) LIGHT SOURCE

(75) Inventor: Kazuki Fujimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 294 days.

(21) Appl. No.: 11/691,852

(22) Filed: Mar. 27, 2007

(65) Prior Publication Data

US 2007/0228303 A1    Oct. 4, 2007

(30) Foreign Application Priority Data

Mar. 31, 2006    (JP) .............................. 2006-098000

(51) Int. Cl.
*G01J 3/10* (2006.01)
(52) U.S. Cl. .............................. 250/504 R; 250/492.1; 315/111.21; 315/111.51
(58) Field of Classification Search ........................ None
See application file for complete search history.

(56) References Cited

U.S. PATENT DOCUMENTS

| | | | |
|---|---|---|---|
| 6,362,871 B1 * | 3/2002 | Bleeker | 355/69 |
| 6,987,279 B2 | 1/2006 | Hoshino et al. | |
| 7,217,941 B2 * | 5/2007 | Rettig et al. | 250/504 R |
| 7,251,012 B2 * | 7/2007 | Banine et al. | 355/30 |
| 7,271,401 B2 * | 9/2007 | Imai et al. | 250/504 R |
| 7,328,885 B2 * | 2/2008 | Schuermann et al. | 250/493.1 |
| 2008/0083887 A1 * | 4/2008 | Komori et al. | 250/504 R |
| 2008/0157006 A1 * | 7/2008 | Wilhelmus Van Herpen et al. | 250/492.2 |
| 2008/0267816 A1 * | 10/2008 | Ueno et al. | 422/24 |

FOREIGN PATENT DOCUMENTS

JP    2005-197456 A    7/2005

* cited by examiner

*Primary Examiner*—David A. Vanore
(74) *Attorney, Agent, or Firm*—Canon U.S.A., Inc. I.P. Division

(57) ABSTRACT

At least one exemplary embodiment is directed to a light source which includes a plasma generator configured to generate plasma, a mirror configured to reflect light that is produced by the plasma, a plurality of plates provided between the plasma and the mirror and arranged radially around an axis passing through a light emission center, and a magnetic-field generator for generating a magnetic line of force between the plasma and the mirror so that trajectories of charged particles scattering from the plasma are curved toward the plates.

7 Claims, 14 Drawing Sheets

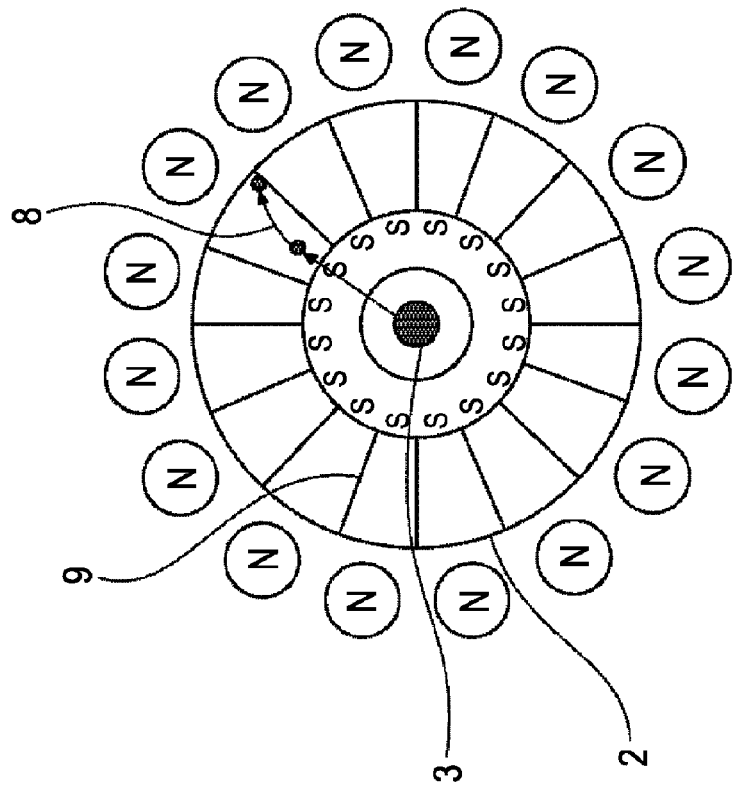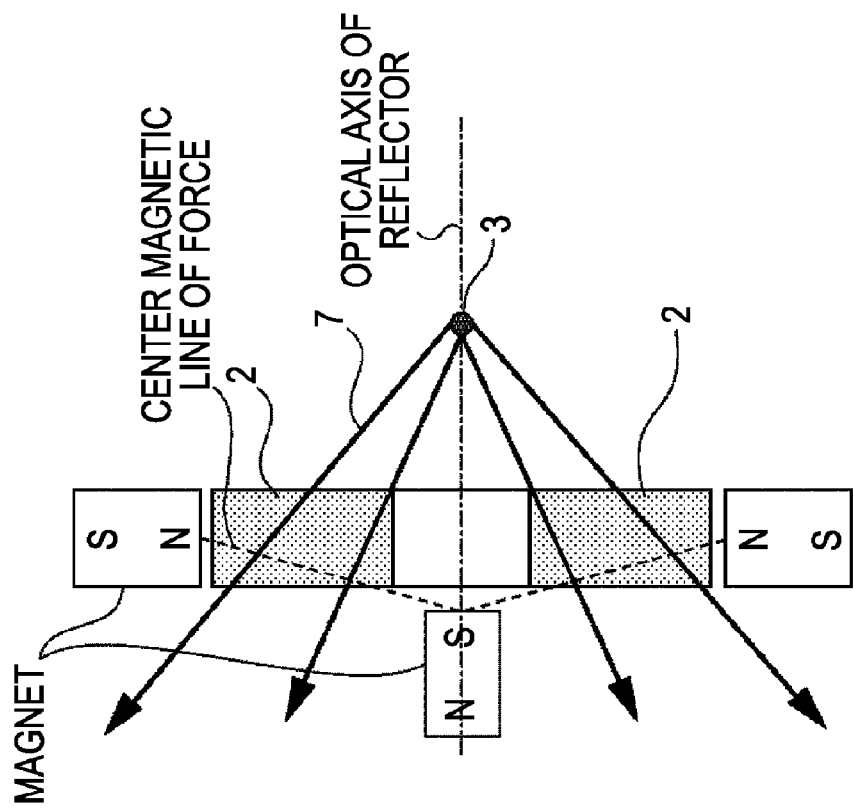

LIGHT SOURCE

BACKGROUND OF THE INVENTION

1. Field of the Invention

The present invention relates to a light source, and more particularly though not exclusively, to a light source that emits EUV (extreme ultraviolet) light.

2. Description of the Related Art

In recent semiconductor manufacturing apparatuses, the wavelength of light emitted from a light source has been shortened, and exposure apparatuses using EUV light have attracted attention as next-generation exposure apparatuses.

A laser produced plasma (LPP) light source is typical of EUV light sources used in EUV exposure apparatuses. FIG. 10 is a schematic view of the LPP light source. In this light source, high-intensity laser light (normally having a repetition frequency of several kilohertz) is applied to a target material, such as xenon, thereby producing high-temperature plasma. From the plasma, EUV light having a wavelength of approximately 13 nm is radiated. The radiated EUV light is reflected by a multilayer mirror, and is guided to an illumination optical system of an exposure apparatus. In addition to the above-described xenon, for example, metal is frequently used as the target material.

When plasma is produced in this light source, besides EUV light, an unnecessary substance called debris scatters from the plasma. Debris particles adhere to or collide with the multilayer mirror, and damage of films of the multilayer mirror. This reduces the reflectance of the multilayer mirror.

In order to prevent this deterioration of the mirror, various countermeasures have been devised. For example, Japanese Patent Laid-Open No. 2005-197456 (counterpart: U.S. Pat. No. 6,987,279 B1) discusses using a magnetic field that is applied near plasma so as to prevent debris particles scattering from the plasma from reaching a mirror, as shown in FIG. 11.

In this case, a target is supplied through a nozzle 104 from a target supply unit 103, and laser light is applied from a driving laser 101 to the target. Consequently, plasma 112 is produced, and EUV light 113 is derived from the plasma 112. A magnetic field is applied in the right-left direction of FIG. 11 by passing a current through coils 106 and 107. Consequently, debris particles (charged particles) produced from the plasma 112 move upward or downward while turning around magnetic lines of force, and are guided outside the mirror. In this way, debris particles scattering from the plasma 112 are prevented from reaching the mirror.

However, in the above-described debris-particle eliminating method, it is difficult to capture debris particles scattering from the plasma at high speed unless a considerably strong magnetic field is applied. Conversely, when the strength of the magnetic field is decreased, debris particles easily reach the mirror, and the mirror deteriorates fast.

SUMMARY OF THE INVENTION

At least one exemplary embodiment is directed to a light source that emits EUV (extreme ultraviolet) light having a wavelength of approximately 10 to 20 nm.

At least one exemplary embodiment of the present invention is directed to a light source in which debris particles produced from plasma can be prevented from reaching a mirror.

A light source according to an aspect of at least one exemplary embodiment of the present invention includes a plasma generator for generating plasma; a mirror for reflecting light that is emitted from the plasma; a plurality of plates provided between the plasma and the mirror and arranged radially around an axis passing through a light emission center; and a magnetic-field generator for generating a magnetic line of force between the plasma and the mirror so that trajectories of charged particles scattering from the plasma are curved toward the plates.

Further features of the present invention will become apparent from the following description of exemplary embodiments with reference to the attached drawings.

BRIEF DESCRIPTION OF THE DRAWINGS

FIGS. 4A and 4B are schematic structural views showing a second exemplary embodiment of the present invention.

DESCRIPTION OF THE EMBODIMENTS

Figure 1:
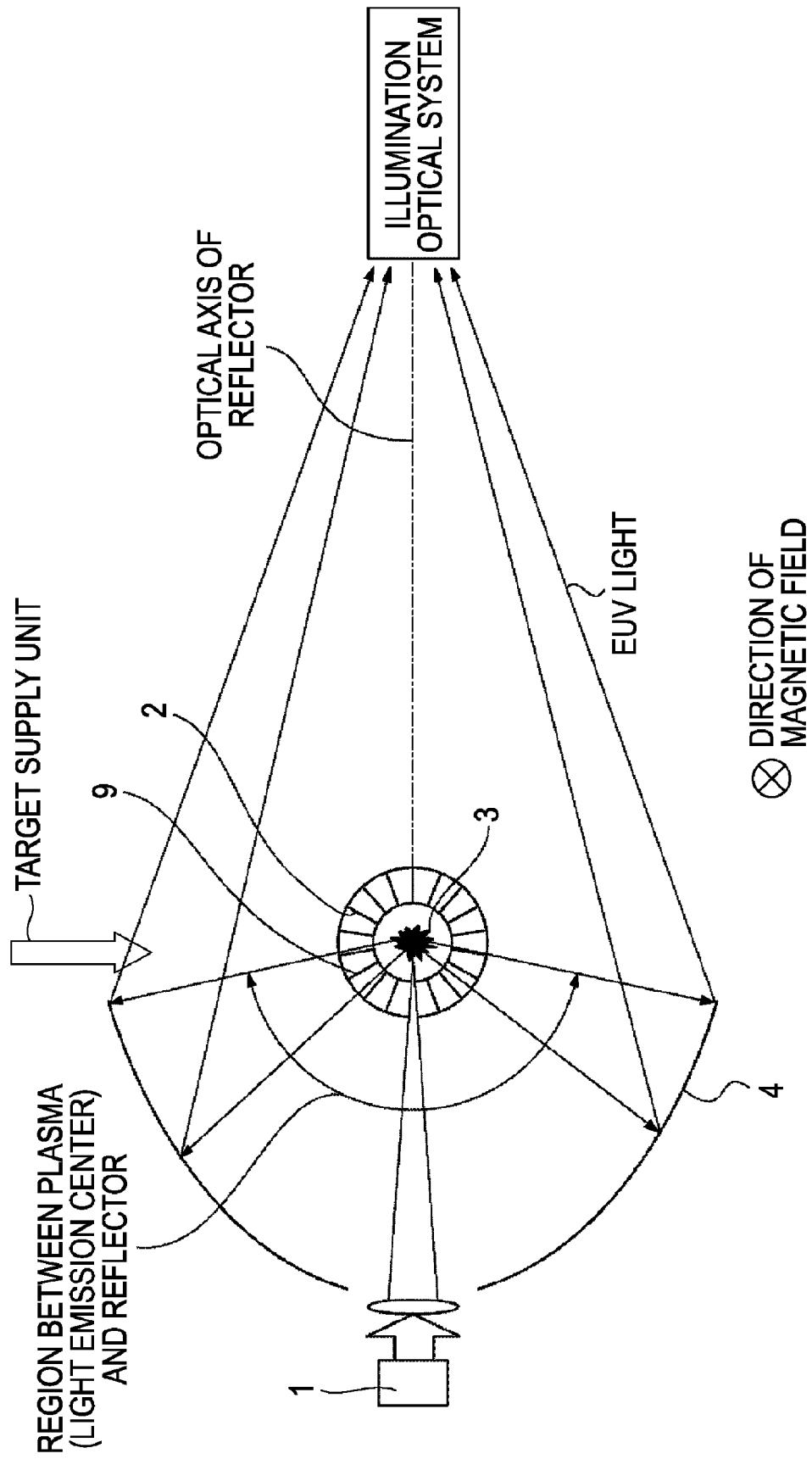
FIG. 1 is a schematic structural view of a light source according to a first exemplary embodiment of the present invention.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication of the adhesion plates and their materials.

In all of the examples illustrated and discussed herein any specific values, for example the wavelength of light emitted from the plasma and the size of the plasma, should be interpreted to be illustrative only and non limiting. Thus, other examples of the exemplary embodiments could have different values.

Notice that similar reference numerals and letters refer to similar items in the following figures, and thus once an item is defined in one figure, it may not be discussed for following figures.

Note that herein when referring to preventing debris particles from reaching a mirror or eliminating debris in a light source, a reduction of the occurrence of debris particles reaching the mirror, when the practices of exemplary embodiments are employed, is also or alternatively intended.

Descriptions will now be given below of EUV light sources that emit EUV light (for example light having a wavelength of approximately 10 to 20 nm, and in at least one exemplary embodiment 13 to 14 nm) according to exemplary embodiments of the present invention, particularly, a method for eliminating debris in the EUV light sources. An exposure apparatus using the EUV light source and a device manufacturing method using the exposure apparatus according to other exemplary embodiments of the present invention will also be described. While the light source in the exemplary embodiments is a LPP light source, exemplary embodiments of the present invention are also applicable to a discharge produced plasma (DPP) light source, and to any device (particularly, a light source) that has problems similar to the problems solved by exemplary embodiments of the present invention. Furthermore, exemplary embodiments are applied not only to a light source for EUV light, but can also be applied to any light source that emits light by using plasma.

First Exemplary Embodiment

FIG. 1 is a schematic view of a LPP light source according to a first exemplary embodiment of the present invention. In the first exemplary embodiment a magnetic field is applied by a magnetic-field generator to a space where a debris filter is placed, as shown in FIG. 1. While a magnetic field is applied from the front side of the paper of FIG. 1 to the back side in the exemplary embodiment, it can be applied in an opposite direction. The LPP light source will be described in detail below.

The LPP light source includes a laser source 1, such as a YAG laser, a debris filter 2, plasma 3 (a light emitting point of EUV light), and a reflector (multilayer mirror) 4. Laser light is applied from the laser source 1 to a target (e.g., xenon or tin) supplied by a target supply unit, thereby generating plasma. That is, the laser source 1 and the target supply unit constitute a plasma generator.

EUV light emitted from the plasma is reflected by the reflector 4, and is guided to, for example, an illumination optical system of an exposure apparatus. The diameter (size in the up-down direction of the plane of FIG. 1) of the debris filter 2 is thirty percent of the diameter of the reflector 4 or less (for example in another exemplary embodiment, twenty percent or less). Therefore, there is little necessity to consider the reduction in light amount due to blocking of the reflected light by the debris filter 2. Herein, the light emitting point of EUV light refers to the center of a region where EUV light is emitted from the plasma (the light emitting point is not an ideal point, but is a substantially spherical region having a diameter of 1 to 1000 μm, and in at least one exemplary embodiment, 10 to 200 μm). The light emission center of the EUV light is any of the center of gravity (center of gravity of light emission) defined in consideration of the amount of emitted light and the light emitting position, the center defined only in consideration of the light emitting position, and an intersection of (the center of) the trajectory of the target supplied by the target supply unit and (the center of) the optical path of the laser light. While the laser light passes through the center of the reflector 4 and the target is supplied from the upper side of the plane of FIG. 1, for example, the relationship between the laser light and the target can be reversed, and the target can be supplied from any direction as long as the trajectory of the target is substantially perpendicular to the optical axis of the reflector 4. Of course, the propagating direction of the laser light and the target supply direction can oppose each other.

The debris filter 2 includes a plurality of debris adhesion plates 9. The debris adhesion plates 9 are radially arranged around the light emission center (adjacent debris adhesion plates 9 are not parallel to each other) such as to rarely block light radiated from the light emitting point. In FIG. 1, the debris adhesion plates 9 are radially arranged around a straight line extending perpendicularly to the plane of the figure and passing through the light emission center. In other words, an intersection line of two planes including two debris adhesion plates placed in a region between the light emitting point and the reflector 4 passes through the light emission center, and is substantially perpendicular to the optical axis of the reflector 4 (the acute angle formed between the intersection line and the optical axis is more than 60°, for example in at least one exemplary embodiment, more than 80°).

Since the debris adhesion plates 9 are disposed near the plasma whose temperature is approximately 10000°, they can be formed of thin plates that are made of a material having a high melting point (2000° or more), for example, tantalum or tungsten. Of course, the debris adhesion plates 9 can be formed of thin plates made of other materials having high melting points. While the debris adhesion plates 9 can be formed of flat plates, they can also be formed of grid-shaped members or strong films.

In the configuration shown in FIG. 1, a magnetic field is applied to a debris-adhesion-plate region where the debris adhesion plates 9 are provided, a region between the debris-adhesion-plate region and the light emitting point, and a plasma production region (light emitting region) in the direction shown in the figure. Magnetic lines of force in the magnetic field are substantially parallel to the debris adhesion plates 9 (the acute angle formed by the magnetic lines of force and the debris adhesion plates 9 is 30° or less, and in at least one exemplary embodiment, 10° or less).

The debris adhesion plates 9, the propagation trajectory of EUV light, the trajectories of debris particles scattering from the light emitting point 3 will now be described with reference to FIG. 2.

Figure 2:
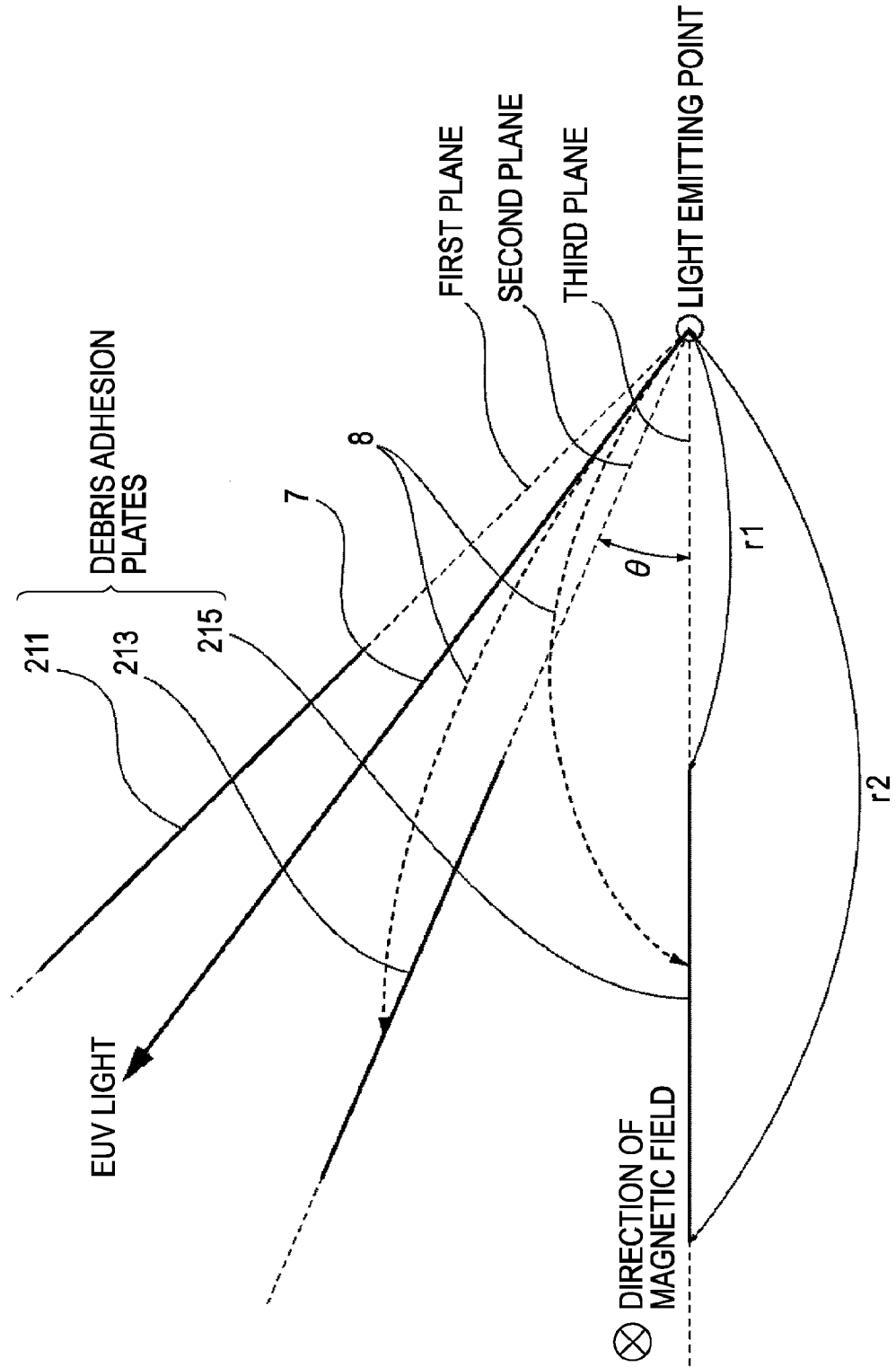
FIG. 2 is an explanatory view showing trajectories of debris particles in the first exemplary embodiment.

In FIG. 2, reference numeral 7 denotes the trajectory of contaminant, such as debris particles, when the first exemplary embodiment is not applied and the propagation trajectory of EUV light produced from the light emitting point 3, and reference numeral 8 denotes the trajectories of contaminant when the first exemplary embodiment is applied.

In this LPP light source, light (EUV light) emitted from the light emitting point 3 draws the trajectory 7, reaches the reflector 4, is reflected by the reflector 4, and then propagates to an optical system such as an illumination optical system of the exposure apparatus.

Contaminant, such as debris, scattering from the light emitting point 3 follows a trajectory similar to the trajectory 7 of the EUV light, and travels toward the reflector 4. However, in a device that emits light by using plasma, such as a LPP light source, most part of debris is charged. When charged debris particles (charged particles) travel along the trajectory 7, a Lorentz force having a component perpendicular to the traveling direction and the magnetic field (a component in the in-plane direction of FIG. 1) is applied to the debris particles because a magnetic field is applied in the direction perpendicular to the plane of FIG. 1 by a magnetic-field producing unit. Therefore, the debris particles follow trajectories 8, and collide with the debris adhesion plates 9. Consequently, most of the debris particles adhere to the debris adhesion plates 9, or most kinetic energy of the debris particles is lost.

In this way, when debris particles move toward the reflector 4 (a velocity vector of the debris particles has a component traveling toward the reflector 4), the trajectories of the debris particles are curved by the influence of the magnetic field, and the debris particles collide with the debris adhesion plates 9. This reduces the number of debris particles that reach and adhere to the reflector 4, and prevents the reduction in reflectance of the reflector 4. Even if the debris particles do not adhere to the debris adhesion plates 9, but reach the reflector 4, since the kinetic energy of the debris particles is greatly reduced, it is possible to considerably reduce damage from the debris particles to the multiple films of the reflector 4. Therefore, even when the debris particles do not adhere to the debris adhesion plates 9, the first exemplary embodiment can prevent (suppress) performance degradation of the reflector 4.

Even if some debris particles pass through the debris filter 2, the trajectories of the debris particles, which reach from the light emitting point to the reflector 4, can be lengthened. For this reason, the probability that the debris particles will collide with gas molecules of buffer gas (an inert gas, such as helium, argon, or krypton, or a mixture of them) can be increased. When the debris particles collide with gas molecules of buffer gas, the velocity of the debris particles decreases, or the moving direction of the debris particles changes. This can reduce the number of debris particles that reach the reflector 4 or decrease the velocity at which the debris particles collide with the reflector 4. By thus reducing the number or velocity, degradation of the reflector 4 (reduction in reflectance) can be prevented (suppressed).

The relationship between the arrangement of the debris adhesion plates 9 and the magnetic field will now be described in detail. As shown in FIG. 1, a magnetic field is applied to the debris-filter space where the debris filter 2 is provided and the entire space inside the debris-filter space.

Referring to FIG. 2, a description will be given of conditions concerning the arrangement of the debris adhesion plates 9 in the debris filter 2. It is satisfactory as long as these debris adhesion plates 9 are arranged so as to hardly block EUV light emitted from the light emitting point and to capture charged particles with the magnetic field applied to the space where the debris filter 2 is provided. More specifically, the following conditions are satisfied:

(1) Each of a plurality of debris adhesion plates is disposed in a plane including the light emitting point. Alternatively, a plurality of debris adhesion plates are arranged perpendicularly to a common plane including the light emitting point (the acute angle formed by each debris adhesion plate and the common plane is 60° or more, for example in at least one exemplary embodiment, 80° or more), or radially arranged around a straight line including the light emitting point (the acute angle formed between the debris adhesion plates is 30° or less, for example in at least one exemplary embodiment, 10° or less).

First and second debris adhesion plates that are adjacent to each other, of a plurality of debris adhesion plates (debris adhesion plates disposed in planes including the light emitting point and substantially parallel to the magnetic lines of force) will be described as an example. The first debris adhesion plate is disposed in a first plane including the light emitting point, and the second debris adhesion plate is disposed in a second plane similarly including the light emitting point.

Since the first (second) debris adhesion plate has a thickness, strictly, it is not completely included in the first (second) plane. Herein, it is satisfactory as long as the acute angle formed by the first (second) debris adhesion plate (one of the surfaces perpendicular to the thickness direction, or an intermediate plane in the thickness direction) and the first (second) plane (or the acute angle formed between the normals thereto) is less than 30° (for example in at least one exemplary embodiment, less than 10°).

The above-described "common plane" refers to the plane of FIG. 1 or 2, for example, and a plurality of debris adhesion plates are obviously perpendicular to the plane. Of course, it is not always necessary that the common plane forms 90° with the debris adhesion plates, and the acute angle formed therebetween can be 60° or more (for example in at least one exemplary embodiment, 80° or more) and can vary slightly.

(2) Each of a plurality of debris adhesion plates can be substantially parallel to at least one magnetic line of force (a magnetic line of force passing near the debris adhesion plate) in the debris filter 2 (the angle formed between the debris adhesion plate and the magnetic line of force is less than 30°, for example in at least one exemplary embodiment, less than 10°).

This condition (2) can be broadly interpreted as follows: A magnetic line of force extending in a direction different from the radiating direction from the light emission center is produced in a plane including an intersection line of the first plane including the first debris adhesion plate and the second plane including another (adjacent) debris adhesion plate. In other words, it is satisfactory as long as the magnetic line of force has a component perpendicular to the radiating direction from the light emission center in the plane. By satisfying this condition, the directions of debris particles scattering from the light emitting point can be curved toward the debris adhesion plates. Herein, the radiating direction refers to the directions of lines radially extending from a certain point (light emission center in this case).

Figure 9A:
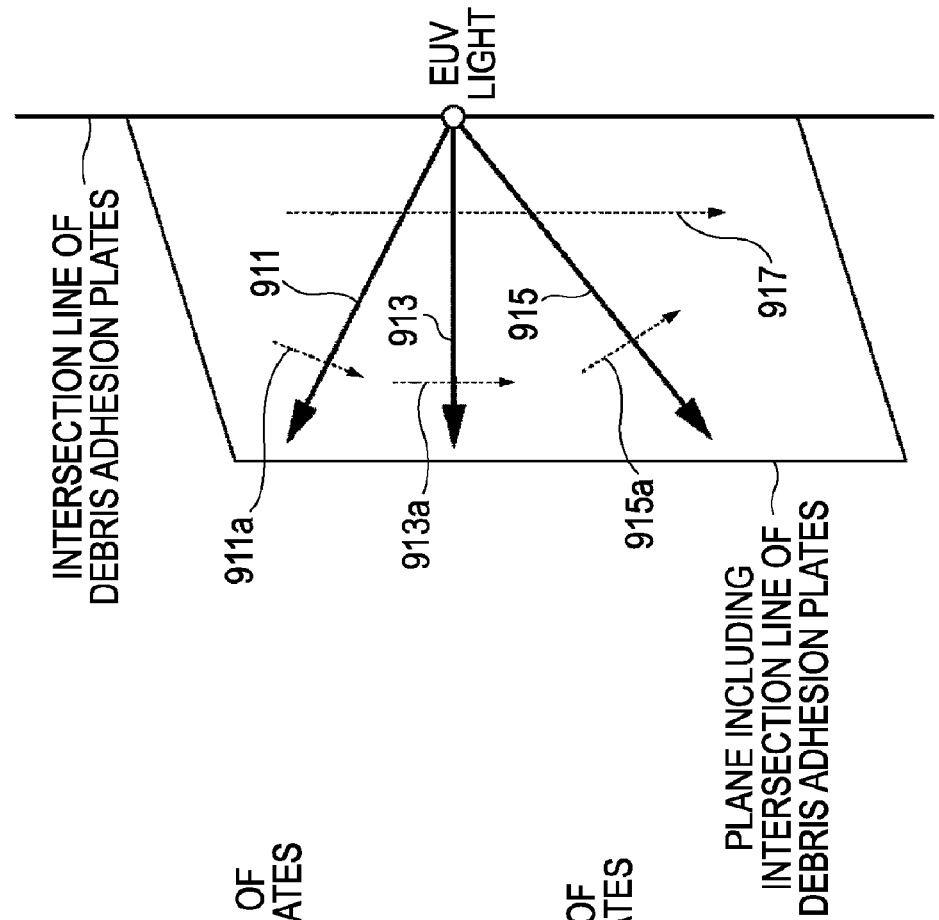
FIGS. 9A and 9B are explanatory views showing the direction of a magnetic line of force in the first exemplary embodiment.
Figure 9B:
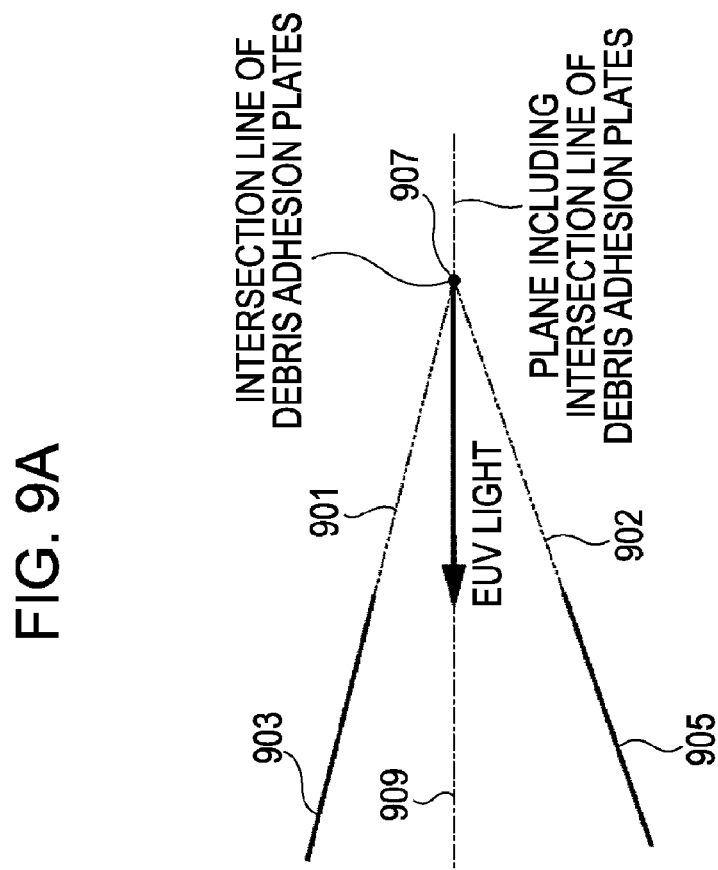
Figure 10:
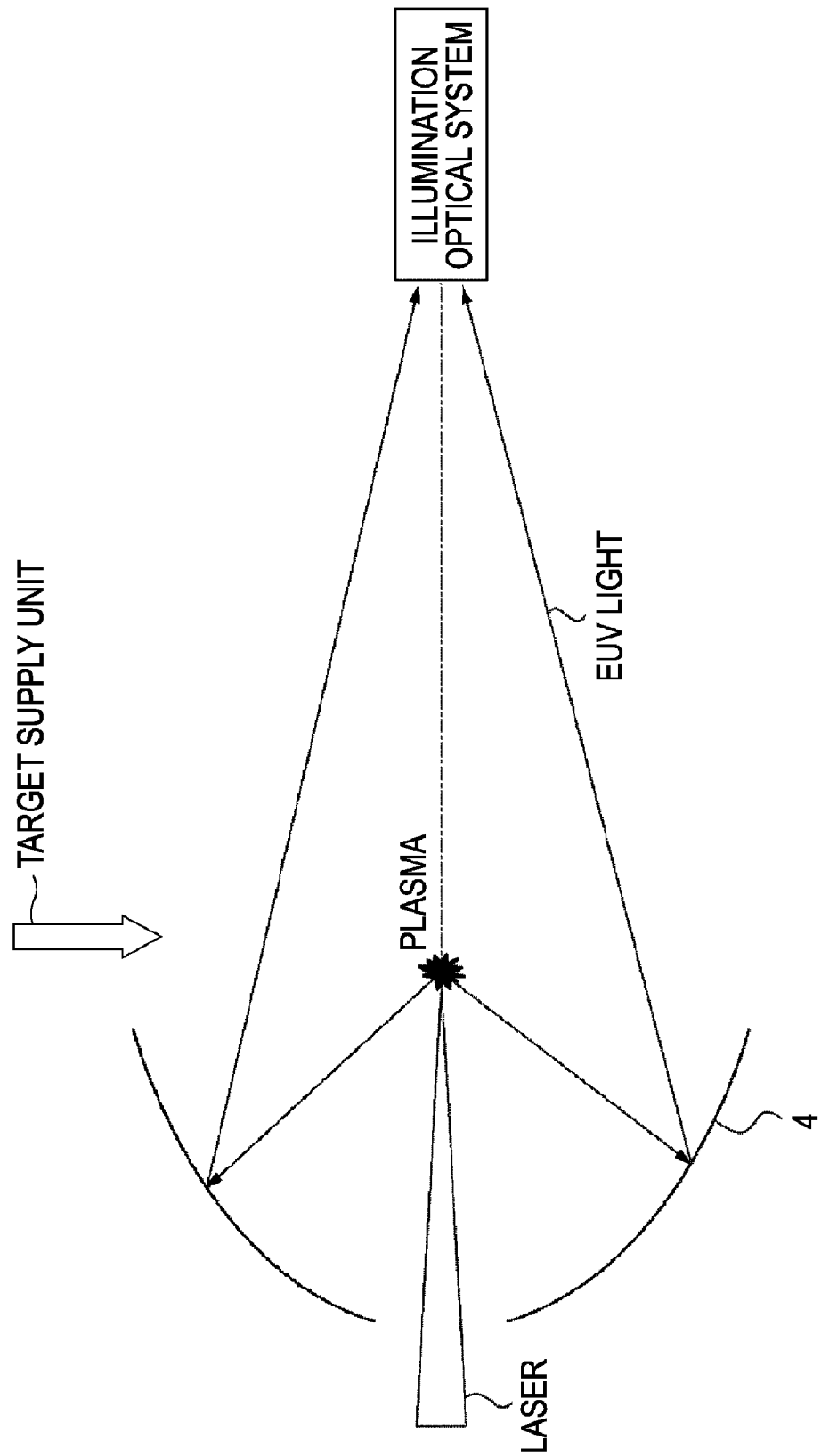
FIG. 10 is an explanatory view of a related art.
Figure 11:
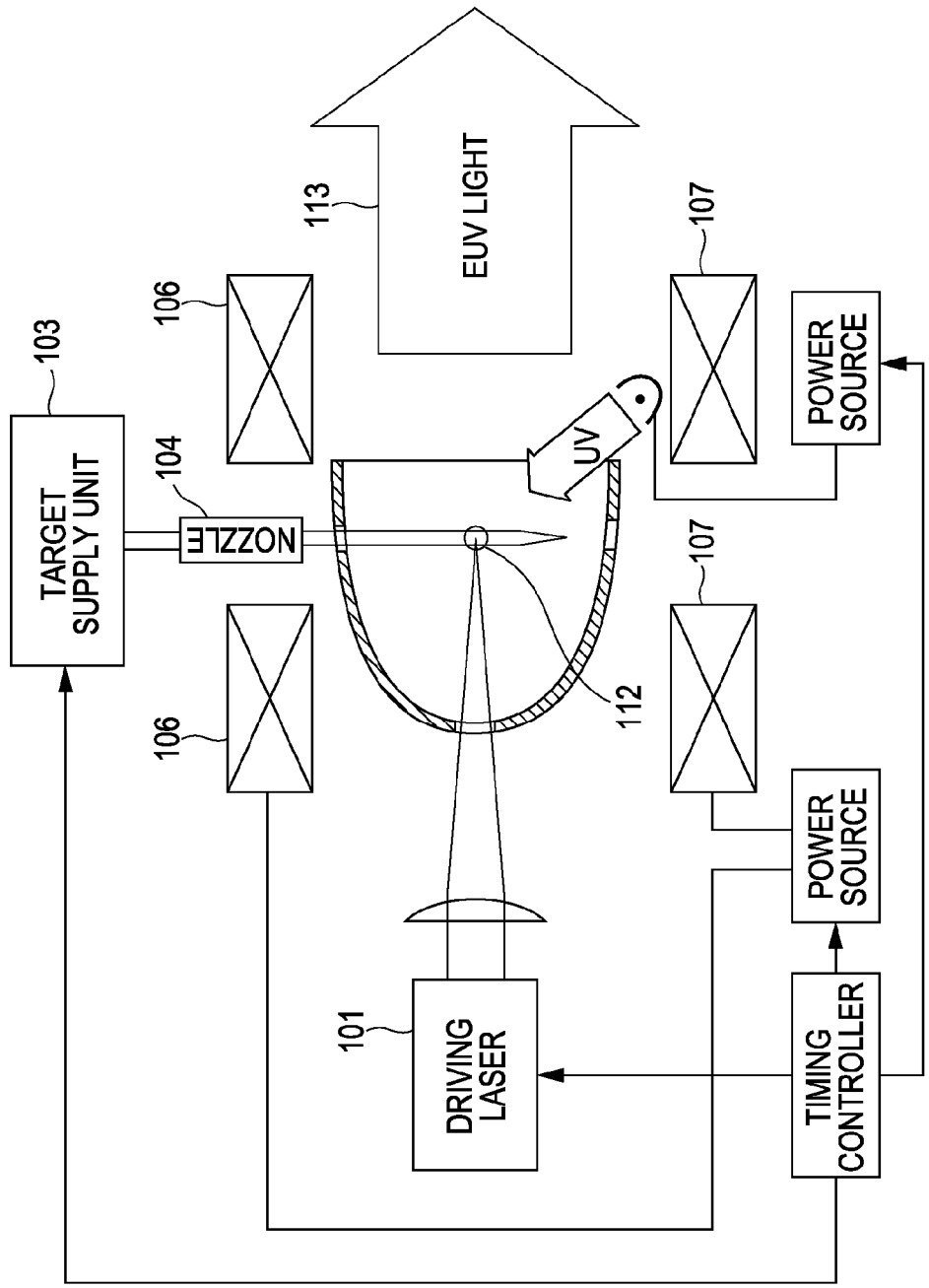
FIG. 11 is an explanatory view of another related art.

A more detailed description will be given with reference to FIGS. 9A and 9B. In FIGS. 9A and 9B, two-dot chain lines (901 and 902) show planes including two adjacent debris adhesion plates (903 and 905) that are radially arranged from a predetermined axis including the light emitting point. These two planes include the light emission center 907. In FIG. 9A, an intersection line of the two planes is indicated by "intersection line of debris adhesion plates", and a plane passing through the intersection line is indicated by "plane including intersection line of debris adhesion plates." Arrow "EUV light" shows the optical path of EUV light, and the trajectory of debris particles scattering from the light emitting point drawn when a magnetic field is not applied. A One-dot chain line 909 shows a predetermined plane including the above-described "intersection line of debris adhesion plates." FIG. 9B shows three optical paths (911, 913, and 915) of EUV light propagating in the predetermined plane. In FIG. 9B, "magnetic line of force in first exemplary embodiment" shown by a dotted line 917 indicates an example of a magnetic line of force passing in the predetermined plane in the first exemplary embodiment. Of course, the magnetic line of force 917 can be slightly curved outward (away from the light emitting point). When the magnetic line of force includes "vertical components" (911a, 913a, 915a) shown in the figure, the trajectories of debris particles (charged particles) radially scattering from the light emitting point can be curved outside the plane including the intersection line of the debris adhesion plates. When the trajectories of the debris particles are curved by applying a force (Lorentz force) to the debris particles in the outward direction, that is, toward the debris adhesion plates, the debris particles collide with the debris adhesion plates. Consequently, kinetic energy of the debris particles can be lost. At least one exemplary embodiment has the vector of the magnetic line of force at a predetermined position that has at least a component that is perpendicular to the radiating direction from the light emitting point at the predetermined position and includes a vector component in a plane containing the above-described intersection line. In at least one exemplary embodiment, the predetermined position is provided in a filter space between two adjacent debris adhesion plates, or in a region between the filter space and the light emitting point and between the light emitting point and the reflector.

The magnetic field in the space where the debris filter 2 is disposed is not always constant. In other words, all magnetic lines of force are not always straight between N and S poles provided at both ends (front and back sides of the plane of FIG. 1) of the debris filter 2. Accordingly, it is satisfactory as long as each debris adhesion plate (one of the surfaces perpendicular to the thickness direction, or an intermediate plane in the thickness direction) in the debris filter 2 is substantially parallel to a central magnetic line of force formed between the two magnetic poles (or a straight line linking the centers of the two magnetic poles). Herein, the phrase "substantially parallel" means that the acute angle formed between the debris adhesion plates and the magnetic line of force is 30° or less, for example in at least one exemplary embodiment, 10° or less. That is, the angle formed between the normal to the debris adhesion plate and the magnetic line of force is 60° or more (for example in at least one exemplary embodiment, 80° or more).

Figure 3:
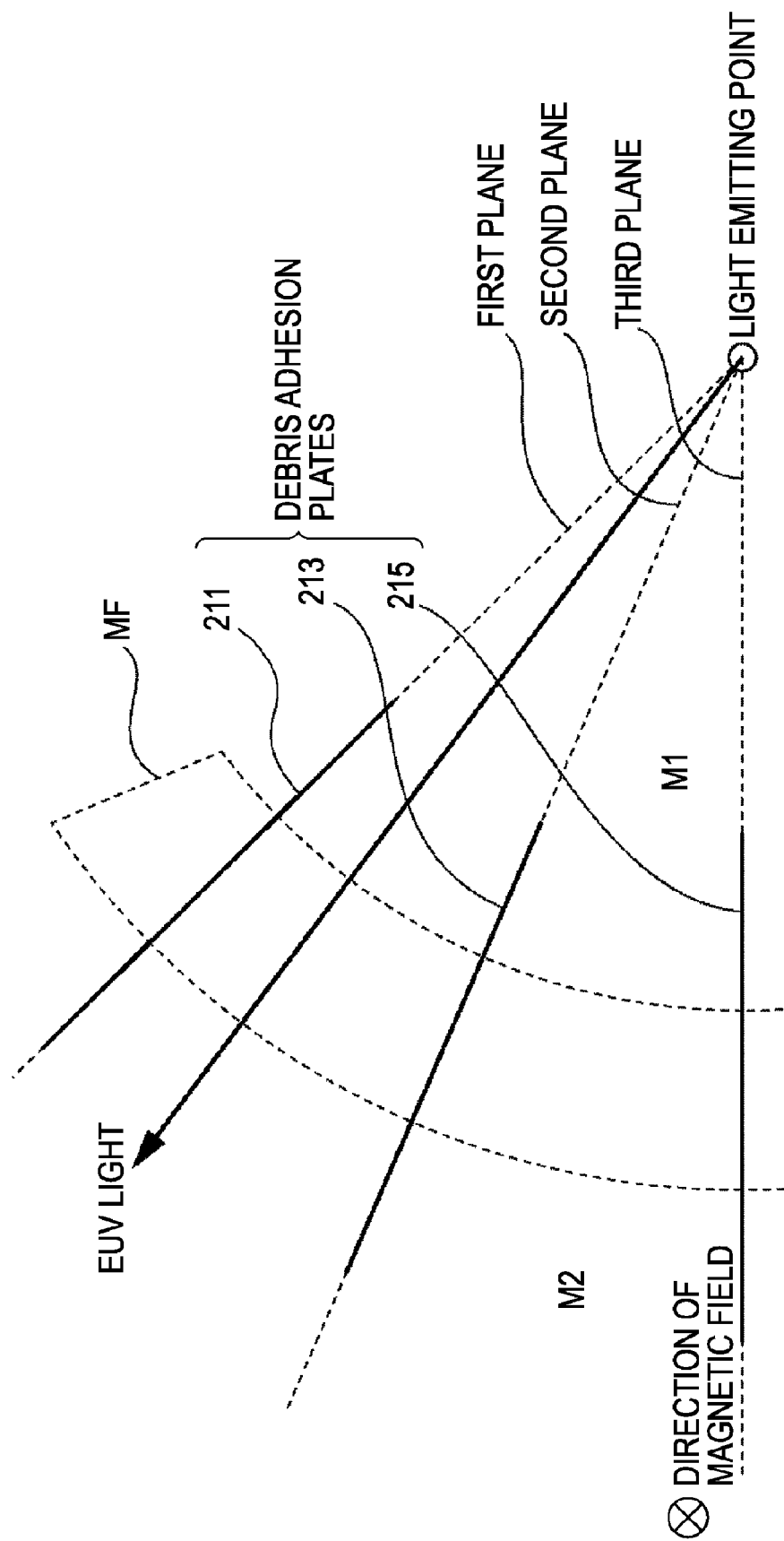
FIG. 3 is an explanatory view showing a modification of the first exemplary embodiment.

Various modifications of manners for applying the magnetic field are possible. For example, as shown in FIG. 3, a magnetic field is applied only to parts of debris adhesion plates (debris filter 2). While a magnetic field region MF is shaped like a doughnut or a part of a doughnut herein, the shape of the magnetic field region is not limited thereto. However, even when a magnetic field is applied only to parts of the debris adhesion plates, the magnetic field intensity (magnetic flux density) in regions other than the magnetic field region does not always need to be zero. That is, the magnetic flux near the debris adhesion plates can have a distribution in density (magnetic flux density).

In FIG. 3, non-magnetic field regions (regions that are not provided between magnets, or regions having a low magnetic flux density) are provided on both a side (M1, light-emitting-point side) of the magnetic field region (a region between the magnets) close to the light emitting point and a side (M2, reflector side) remote from the light emitting point. However, a non-magnetic field region can also be provided on only one of the light-emitting-point side and the reflector side (opposite to the light emitting point) of the magnetic field region.

(3) Two adjacent debris adhesion plates (of a plurality of debris adhesion plates placed in planes including the light emitting point) are generally not parallel to each other although in subsequent exemplary embodiments they can be.

As shown in FIG. 2, the adjacent first and second debris adhesion plates 211 and 213 respectively (first and second planes) are not parallel to each other (are inclined with respect to each other). The angle formed between these debris adhesion plates can be more than 0° (for example in at least one exemplary embodiment, more than 3°) and less than 60° (for example in at least one exemplary embodiment, less than 30°, and in another exemplary embodiment, less than 10°).

In at least one exemplary embodiment all debris adhesion plates (for example, 211, 213, 215) satisfy the above-described conditions (1) to (3). In at least one further exemplary embodiments, the conditions (1) and (2) are satisfied, and in at least one further exemplary embodiment, it is satisfactory as long as at least some of the debris adhesion plates satisfy the conditions. In at least one exemplary embodiment half or more, for example, two thirds or more of the debris adhesion plates satisfy the conditions. Strictly, the debris adhesion plates concerning the above conditions refer only to debris adhesion plates placed in the region between the light emitting point 3 and the reflector 4 (FIG. 1). That is, debris adhesion plates provided outside the region between the light emitting point 3 and the reflector 4 do not necessarily satisfy the conditions.

When the debris filter 2 is configured to satisfy the above conditions (1), (2), and (3), it is possible to prevent or decrease the reduction of the reflectance (light propagation rate) of the reflector (optical element that EUV light emitted from the light emitting point first enters).

While the magnetic field is formed by permanent magnets in the first exemplary embodiment, it can be formed by electromagnets or other methods and devices. That is, the magnetic-field producing unit is not limited to the permanent magnets adopted in the first exemplary embodiment.

The above-described conditions are also applied to a second exemplary embodiment that will be described below.

Figure 7:
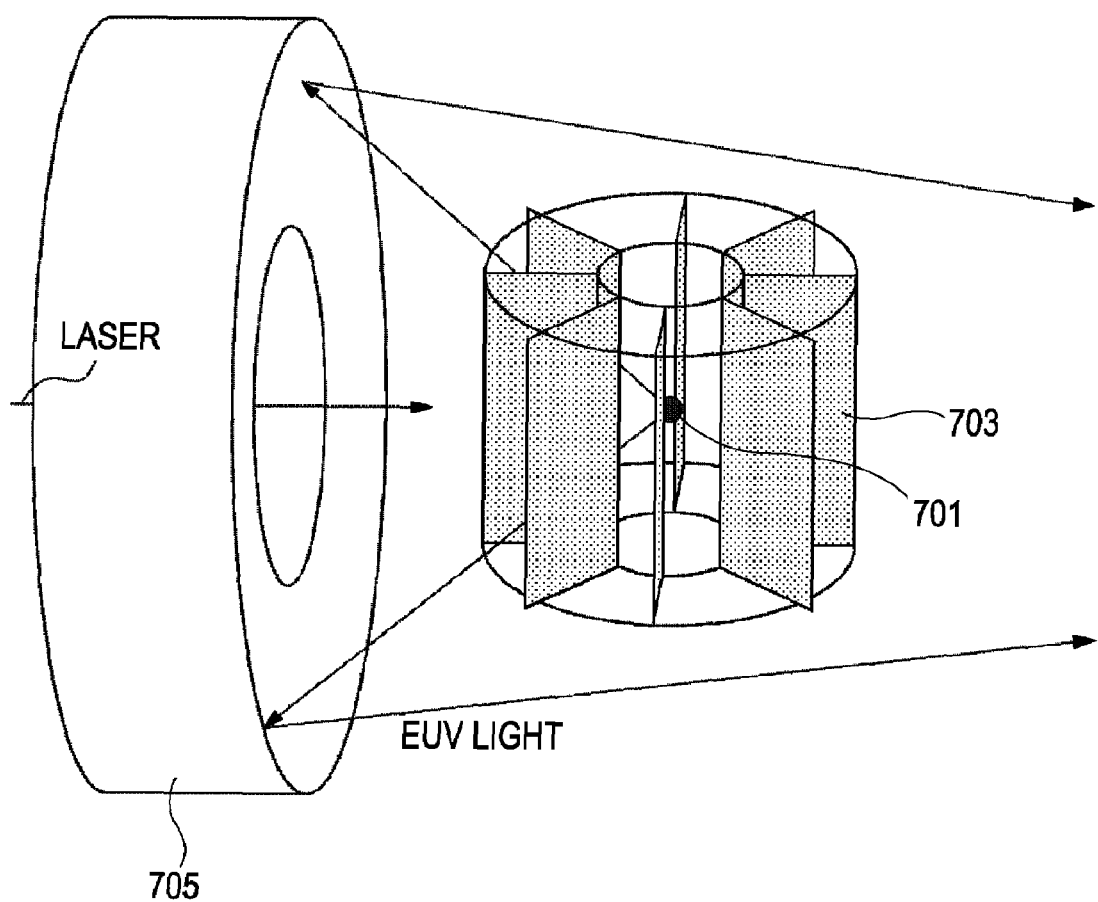
FIG. 7 is an explanatory view showing the arrangement of magnets in the first exemplary embodiment.
Figure 8:
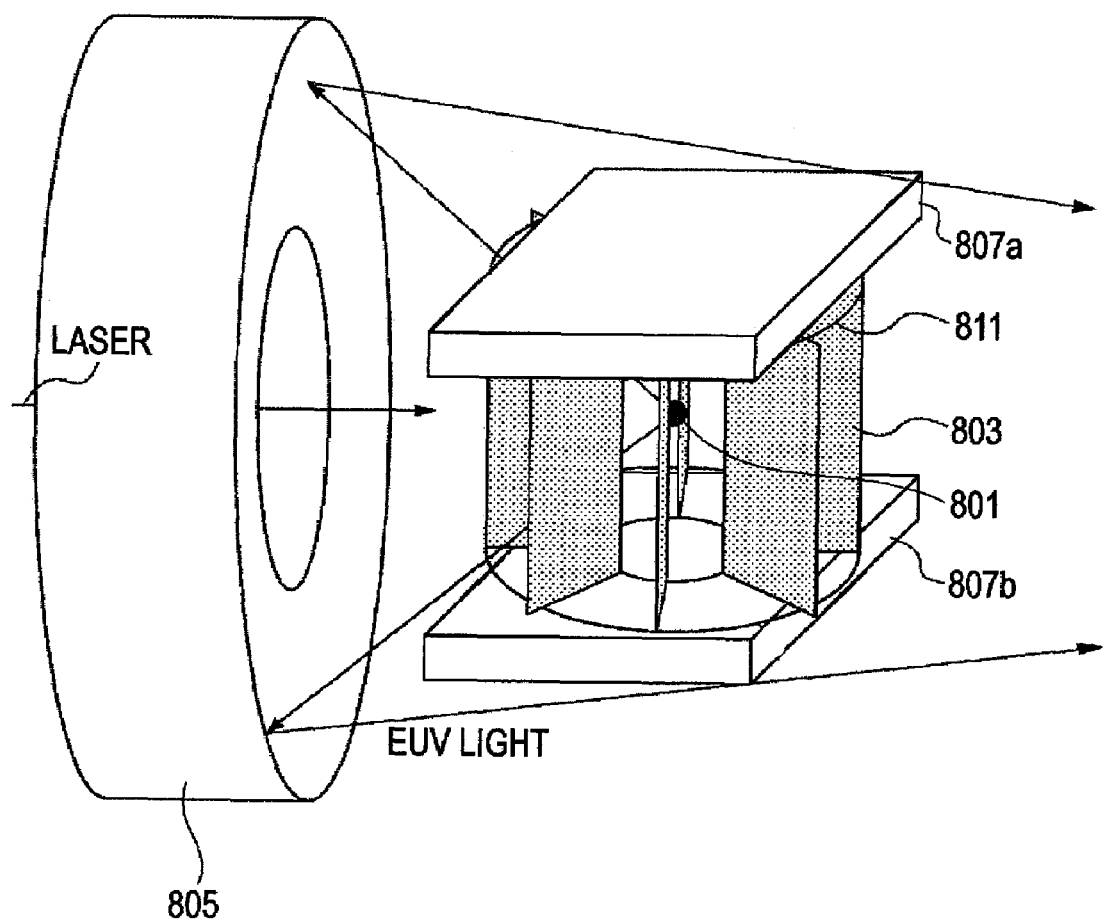
FIG. 8 is an explanatory view showing the arrangement of the magnets in the first exemplary embodiment.

FIGS. 7 and 8 show the light emitting point 701 and 801, the debris adhesion plates 703 and 803, and the reflector, 705 and 805, arranged in consideration of the positional relationship among the components. In FIG. 8, permanent magnets (or electromagnets) are actually provided as the magnetic-field producing unit (e.g., which includes permanent magnets 807a and 807b). FIG. 7 is an explanatory view that allows the configuration shown in FIG. 8 to be viewed easily. As shown in FIG. 8, a pair of permanent magnets (807a and 807b) are disposed such as to face each other along an axis including the light emitting point (intersection line of the debris adhesion plates in FIG. 9). A plurality of debris adhesion plates (e.g., 803) are connected by connecting members 811. While the connecting members are shaped like a line in FIGS. 7 and 8, they can be shaped like a plate or can have other shapes. However, in at least one exemplary embodiment the connecting members can be disposed outside the region (in the optical path of EUV light, in EUV light beams) between the light emitting point 801 and the reflector 805 so as not to block EUV light. In the case in which the connecting members 811 are disposed in the region between the light emitting point 801 and the reflector 805, and are shaped like a plate, the plate-shaped connecting members can be disposed in planes including the light emitting point. When the target is supplied from the upper side of FIGS. 7 and 8, the connecting members and the magnets can have center holes.

Second Exemplary Embodiment

A second exemplary embodiment of the present invention will now be described with reference to FIGS. 4A and 4B.

According to the condition (2) adopted in the first exemplary embodiment, it is satisfactory as long as each debris adhesion plate is substantially parallel to the magnetic line of force passing through the debris adhesion plate. Therefore, for example, the debris adhesion plates can be arranged in a manner shown in FIGS. 4A and 4B. FIG. 4A is a cross-sectional view of a debris filter 2, taken along a plane including the optical axis of a reflector, and FIG. 4B is a cross-sectional view of the debris filter 2, taken perpendicularly to the optical axis of the reflector and viewed from the light-emitting-point side. As shown in FIG. 4B, magnets are arranged so that magnetic lines of force extend radially in a region where the debris filter 2 is provided. That is, one permanent magnet is disposed on the optical axis of the reflector, and other permanent magnets are arranged outside debris adhesion plates 9 and around an axis including the light emitting point. As the angle formed between the traveling direction of debris (charged particles) and the direction of the magnetic line of force approaches 90°, the Lorentz force increases. Therefore, the magnets and the debris adhesion plates 9 can be arranged so that the angle is close to 90°. In at least one exemplary embodiment, the angle formed between the magnetic line of force (a central magnetic line of force passing through the center of the magnetic flux or a line connecting magnets that have two opposite poles) and the trajectory of EUV light (initial traveling direction of debris) is about 45° or more, (e.g., 60°, 70°).

In the second exemplary embodiment, magnets provided around the debris filter 2 (peripheral magnets) and a magnet provided at the center of the debris filter 2 (central magnet) are arranged so as to have a predetermined positional relationship in order to satisfy the above condition. That is, magnetic flux (central magnetic line of force) formed by each peripheral magnet and the central magnet is inclined with respect to the optical axis of the reflector (the angle formed between the magnetic flux and the optical axis is more than or equal to 45° and less than 85°, and in at least one exemplary embodiment, less than 80°). In other words, the position of each of the peripheral magnet in the direction of the optical axis (of the reflector) can be shifted from the position of the central magnet in the direction of the optical axis. More specifically, in the direction of the optical axis, each peripheral magnet is substantially aligned with the debris filter 2, and the central magnet is disposed farther from the light emitting point than the debris filter 2.

In this way, in the second exemplary embodiment, the magnetic lines of force can extend radially from the position (point) different from the light emitting point, on the optical axis of the reflector. Furthermore, in at least one exemplary embodiment, each of the magnetic lines of force can be inclined with respect to the optical axis of the reflector (i.e. having a portion that is not perpendicular and not parallel to the optical axis) so as to get closer to the light emitting point as it extends away from the optical axis.

The change of the trajectory of debris particles due to the magnetic field will now be examined. While this examination can be commonly conducted for both the first and second exemplary embodiments, a description will be given of examination for the first exemplary embodiment as an example.

In the first exemplary embodiment, debris particles draw a trajectory having a certain curvature due to the influence of the magnetic field. More specifically, the radius R of curvature of the trajectory decreases as the magnetic flux density increases, and increases as the magnetic flux density decreases. When the radius R of curvature is too large or too small, the usefulness of features of exemplary embodiments of the present invention are reduced. Accordingly, the radius R of curvature and the arrangement and structure of debris adhesion plates will be examined.

Figure 5:
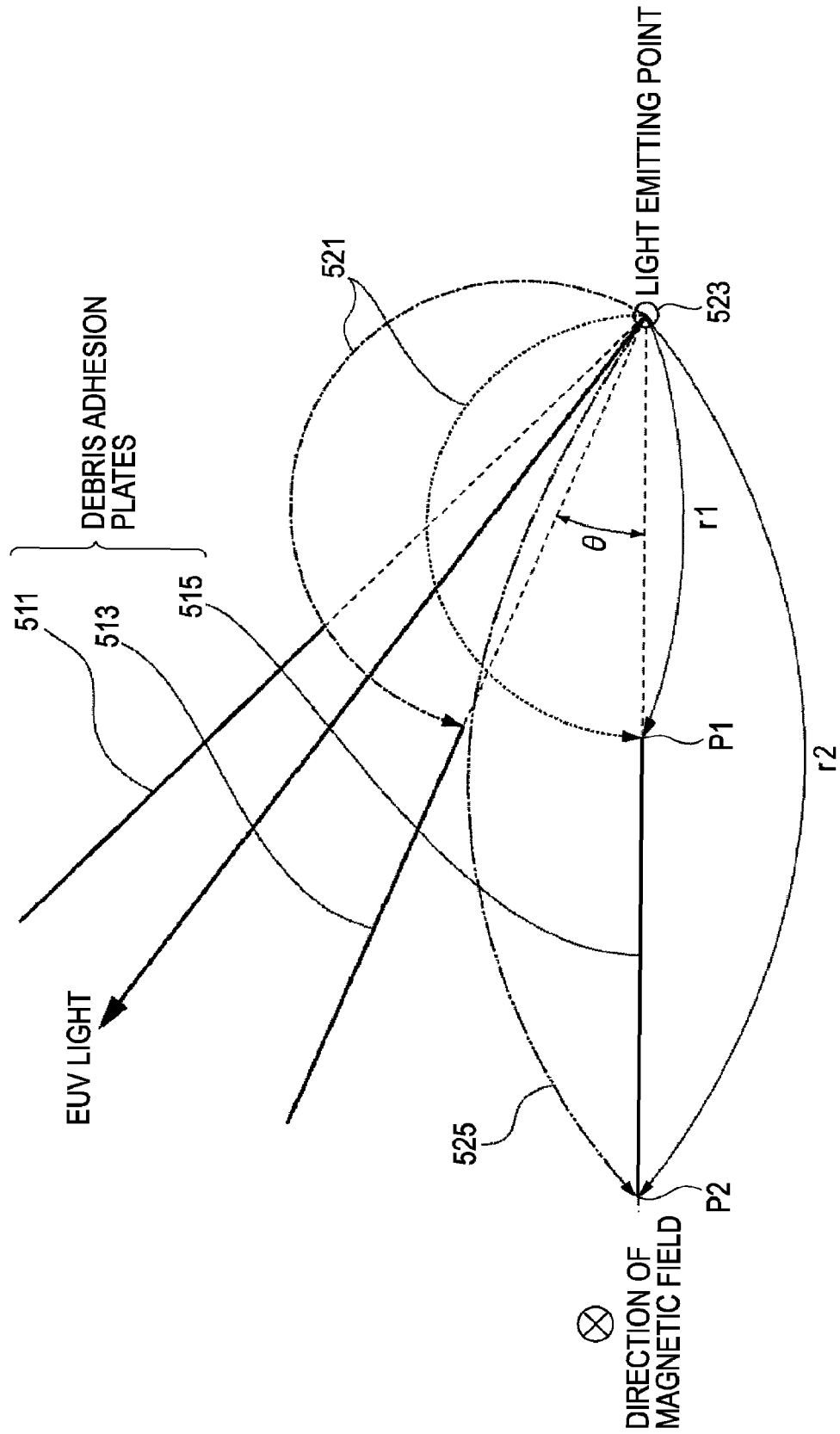
FIG. 5 is an explanatory view showing calculation of the magnetic flux density for capturing debris particles.
Figure 6:
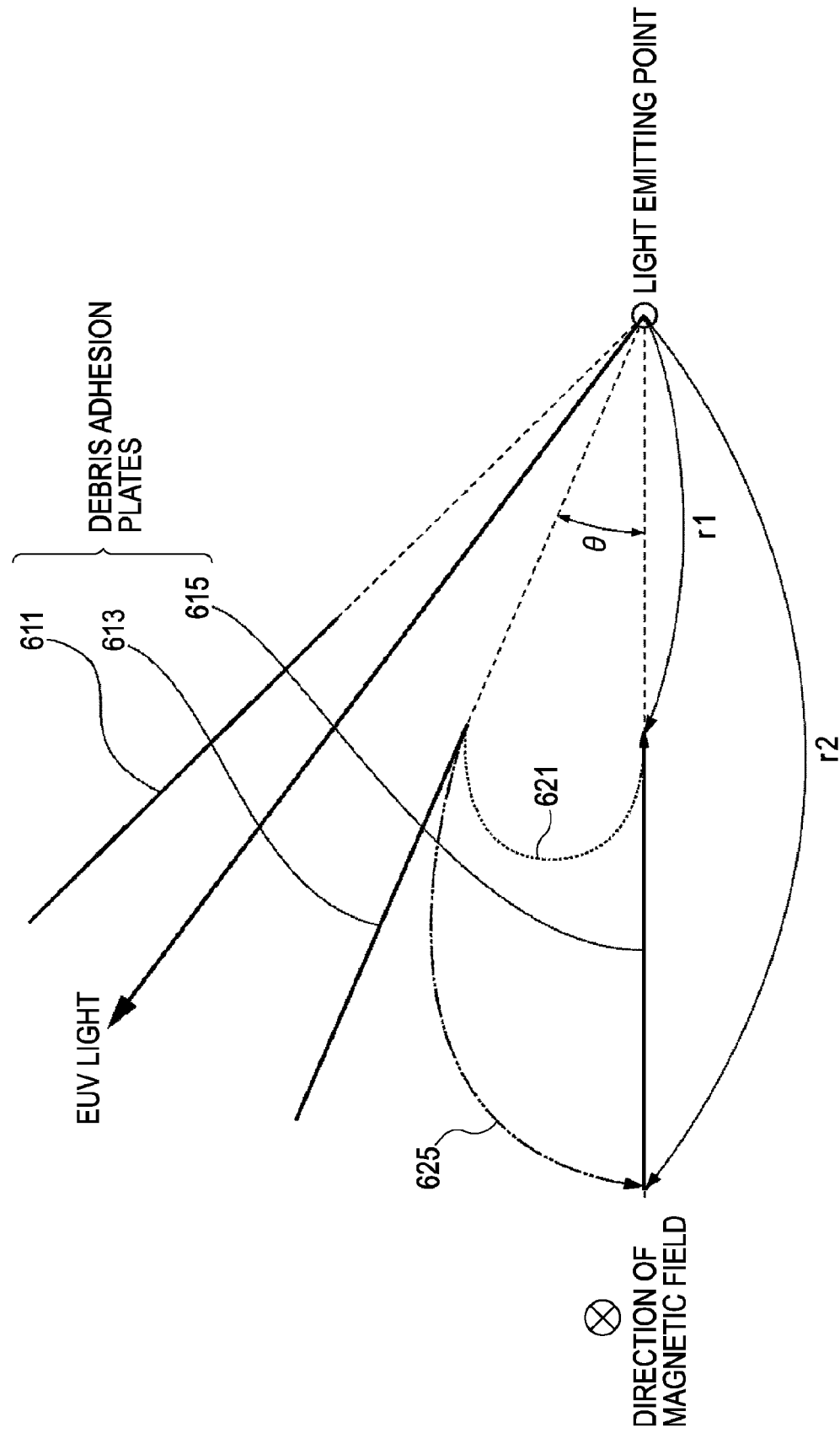
FIG. 6 is an explanatory view showing calculation of the magnetic flux density for capturing debris particles.

When the radius R of curvature is too large, the trajectory of debris particles (charged particles) is negligibly curved, and therefore, there is a high probability that the debris particles will pass between the debris adhesion plates. Conversely, when the radius R of curvature is too small, the debris particles draw a circular trajectory inside the debris adhesion plates (on the light-emitting-point side), and remain suspended between the light emitting point and the debris adhesion plates. Accordingly, optimum ranges of the radius R of curvature are set for the following two conditions (a) and (b) (FIGS. 5 and 6). In the conditions (a) and (b), a magnetic field is constant, and debris adhesion plates are provided inside a magnetic field region (do not protrude from the magnetic field region).

(a) In the case in which a magnetic field region is provided near the light emitting point and in the entire region where debris adhesion plates are disposed (FIG. 5), the following is true:

In FIG. 5, broken lines, one-dot chain lines, and two-dot chain lines show trajectories of debris particles. When the radius R of curvature is the minimum, debris particles draw a trajectory shown by a broken line 521. After moving along this trajectory, debris particles scattering from the light emitting point are captured by ends of the debris adhesion plates close to the light emitting point 523. Conversely, when the radius R of curvature is the maximum, debris particles draw a trajectory shown by a two-dot chain line 525 in FIG. 5. This trajectory passes through an end of the second debris adhesion plate close to the light emitting point and an outside end (an end remote from the light emitting point and close to the reflector) of the third debris adhesion plate adjacent to the second debris adhesion plate (in actuality, the trajectory barely passes through the ends).

In at least one exemplary embodiment, the radius R of curvature is within the range given by the following conditional expression (1):

$$\frac{r1}{2} < R < \sqrt{r1^2 - r1 r2 \cos\theta + \frac{r2^2}{4}} \tag{1}$$

where r1 represents the distance between a light-emitting-point-side end P1 of each debris adhesion plate and the light emitting point 523, r2 represents the distance between a reflector-side end P2 (an end remote from the light emitting point) of each debris adhesion plate and the light emitting point 523, and θ represents the angle formed between the debris adhesion plates in the rotating direction about the light emitting point. In other words, θ represents the angle formed between two adjacent debris adhesion plates, of a plurality of debris adhesion plates disposed in planes including the light emitting point and substantially parallel to the magnetic lines of force at the debris filter (an acute one of the angles formed by the normals to the plates).

However, even when the radius R of curvature is slightly smaller than the lower limit or slightly larger than the upper limit, exemplary embodiments of the present invention are still useful. For example, in a case in which the debris adhesion plates extend outside the magnetic field region (away from the light emitting point in the radiating direction from the light emitting point), exemplary embodiments of the present invention are still useful even when the radius R of curvature slightly deviates from the range defined by the conditional expression (1). Accordingly, the conditional expression (1) can be replaced with the following conditional expression (1-1) or (1-2):

$$\frac{r1}{4} < R < 2\sqrt{r1^2 - r1 r2 \cos\theta + \frac{r2^2}{4}} \tag{1-1}$$

$$\frac{r1}{8} < R < 4\sqrt{r1^2 - r1 r2 \cos\theta + \frac{r2^2}{4}} \tag{1-2}$$

(b) In the case in which a magnetic field is not applied near the light emitting point, but is applied only to a region where the debris adhesion plates are provided (FIG. 6), the following is true:

In FIG. 6, a broken line shows a trajectory of debris when the radius R of curvature is the minimum 621, and a two-dot chain line shows a trajectory of debris when the radius R of curvature is the maximum 625.

In at least one further exemplary embodiment the radius R of curvature satisfies the following conditional expression (2):

$$\frac{(1-\cos\theta)r1}{\sin\theta} < R < \frac{r1^2 + r2^2 - 2r1r2\cos\theta}{2r2\sin\theta} \quad (2)$$

where r1, r2, and θ are the same as those in equation (1) of condition (a).

As for conditional expression (2), exemplary embodiments of the present invention can still be useful even in a range that is slightly lower than the lower limit or slightly higher than the upper limit. Therefore, the conditional expression (2) can be replaced with the following conditional expression (2-1) or (2-2):

$$\frac{(1-\cos\theta)r1}{2\sin\theta} < R < \frac{r1^2 + r2^2 - 2r1r2\cos\theta}{r2\sin\theta} \quad (2\text{-}1)$$

$$\frac{(1-\cos\theta)r1}{4\sin\theta} < R < 2\frac{r1^2 + r2^2 - 2r1r2\cos\theta}{r2\sin\theta} \quad (2\text{-}2)$$

According to the above-described conditions (a) and (b), in order to reduce the number of debris particles that reach the reflector, from among debris particles produced at the light emitting point, in at least one exemplary embodiment the debris adhesion plates can be as large as possible (extend as far as possible in the radiating direction from the light emitting point). However, since the temperature near the light emitting point is high, it can be difficult to extend the debris adhesion plates very close to the light emitting point. It can also be difficult to conversely extend the debris adhesion plates very close to the reflector because the plates can block EUV light reflected by the reflector. Under these circumstances, the above-described conditional expressions (1), (1-1), (1-2), (2), (2-1), and (2-2) optimally set the size and arrangement of the debris adhesion plates and the radius R of curvature of the trajectory of the debris particles.

The positions and intensity of the magnets are adjusted so as to control the intensity of the magnetic field (magnetic flux density) and the direction of the magnetic field (direction of magnetic lines of force) so that these conditional expressions are satisfied. The magnets can, of course, be electromagnets, and in this case, the positions of the electromagnets and the amount of current are adjustable.

The intensity of the magnetic field can be adjusted in accordance with charged particles (debris particles) serving as an object to be adsorbed by the debris adhesion plates. In this case, the object includes debris particles that are strong factors in reducing the reflectance of the reflector, or a large number of debris particles that are expected to be produced as debris. More specifically, when tin is supplied as the target material to be irradiated with laser light at the light emitting point, the debris adhesion plates can adsorb tin ions. When the target material is xenon, the debris adhesion plates can adsorb xenon ions. Since materials other than the target material can be suspended near the light emitting point for some reason, the debris adhesion plates can adsorb these materials. For example, the debris adhesion plates can adsorb the material of an inner wall of a supply pipe through which the target material, such as tin or xenon, is supplied, the material of the debris adhesion plates, or ions of gas supplied as buffer gas (inert gas such as argon). That is, it is satisfactory as long as the intensity of the magnetic field is set so as to satisfy the above conditional expressions as for at least any one of the target material, the material of the supply pipe, and the material of the debris adhesion plates. In this exemplary embodiment, it is unnecessary to supply buffer gas to the space surrounding the light emitting point and the debris filter, and a sufficient result can be achieved without using buffer gas. However, buffer gas can be supplied. The supply of buffer gas can be used in exemplary embodiments, increasing the usefulness, where more debris particles can be captured by the debris adhesion plates.

In the above-described first and second exemplary embodiments, the plates (debris adhesion plates) are arranged radially around the axis passing through the light emission center (an intersection line of the planes passing through a plurality of plates). Further, plates can be added such as to be arranged radially around a second axis passing through the light emission center and extending perpendicularly to the above axis. That is, a plurality of plates can be arranged like a grid.

The plates can have a constant thickness from the side of the light emission center to the opposite side, or a thickness that increases away from the light emission center. Further, the radiating directions refer to directions diverging from a certain point or a certain axis. Of course, the radiating directions do not always refer to all directions, or the distances (angles). The terms "arranged radially" means that a plurality of plates are arranged such as to diverge from a certain point or a certain axis. While the plates do not need to extend in all directions centered on the certain point or the certain axis, nor spaced equally, in at least one exemplary embodiment a plurality of (for example, three or more, ten or more) plates can be arranged.

While the exemplary embodiments are applied to the light source, particularly, to the EUV light source, exemplary embodiments of the present invention are also applicable to other light sources that obtain light from plasma.

Exemplary embodiments of the present invention are also applicable to an exposure apparatus using the above-described light source. That is, exemplary embodiments of the present invention are applicable to an exposure apparatus including an illumination optical system that illuminates a pattern (provided on a reticle or a mask) with light from the above-described light source, and a projection optical system that projects the pattern onto an object (in a reduced size).

Figure 12:
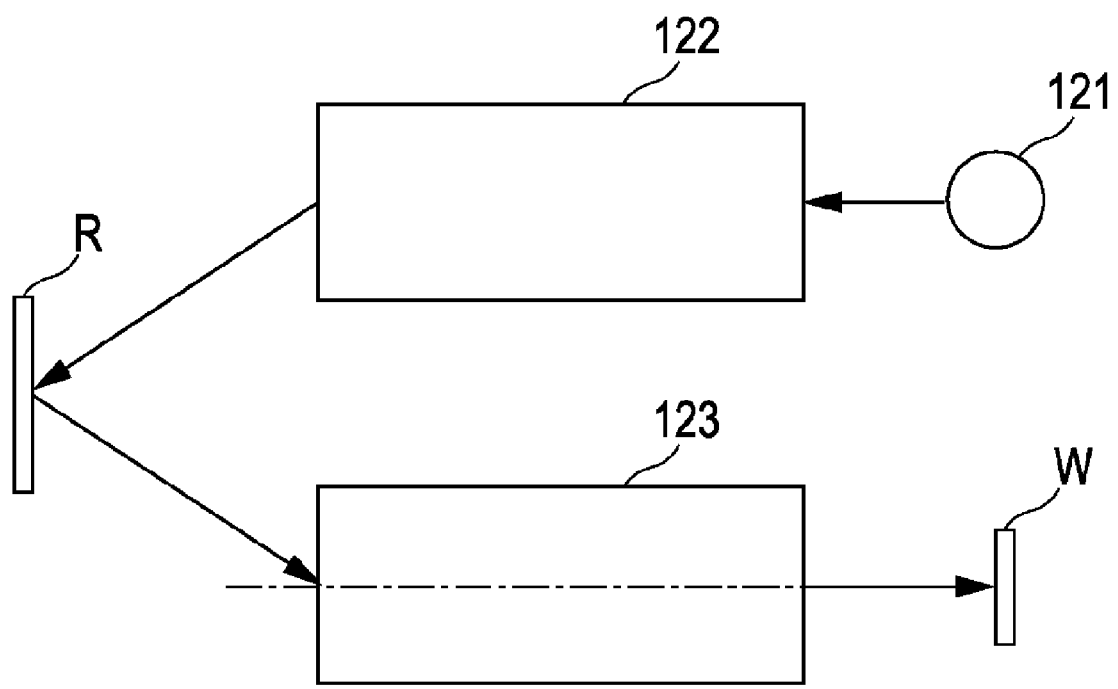
FIG. 12 is a schematic structural view of an exposure apparatus.

FIG. 12 is a schematic view showing the configuration of an exposure apparatus according to at least one exemplary embodiment. As shown in FIG. 12, the exposure apparatus includes a light source 121 to which at least one exemplary embodiment of the present invention is applied, an illumination optical system 122 that illuminates a reflective reticle R having a pattern, and a projection optical system 123 that transfers the pattern onto a wafer W in a reduced size.

At least one exemplary embodiment of the present invention is also applicable to a device manufacturing method using the above-described exposure apparatus. A description will be given below of a semiconductor-device manufacturing method using the exposure apparatus according to a further exemplary embodiment of the present invention.

Figure 13:
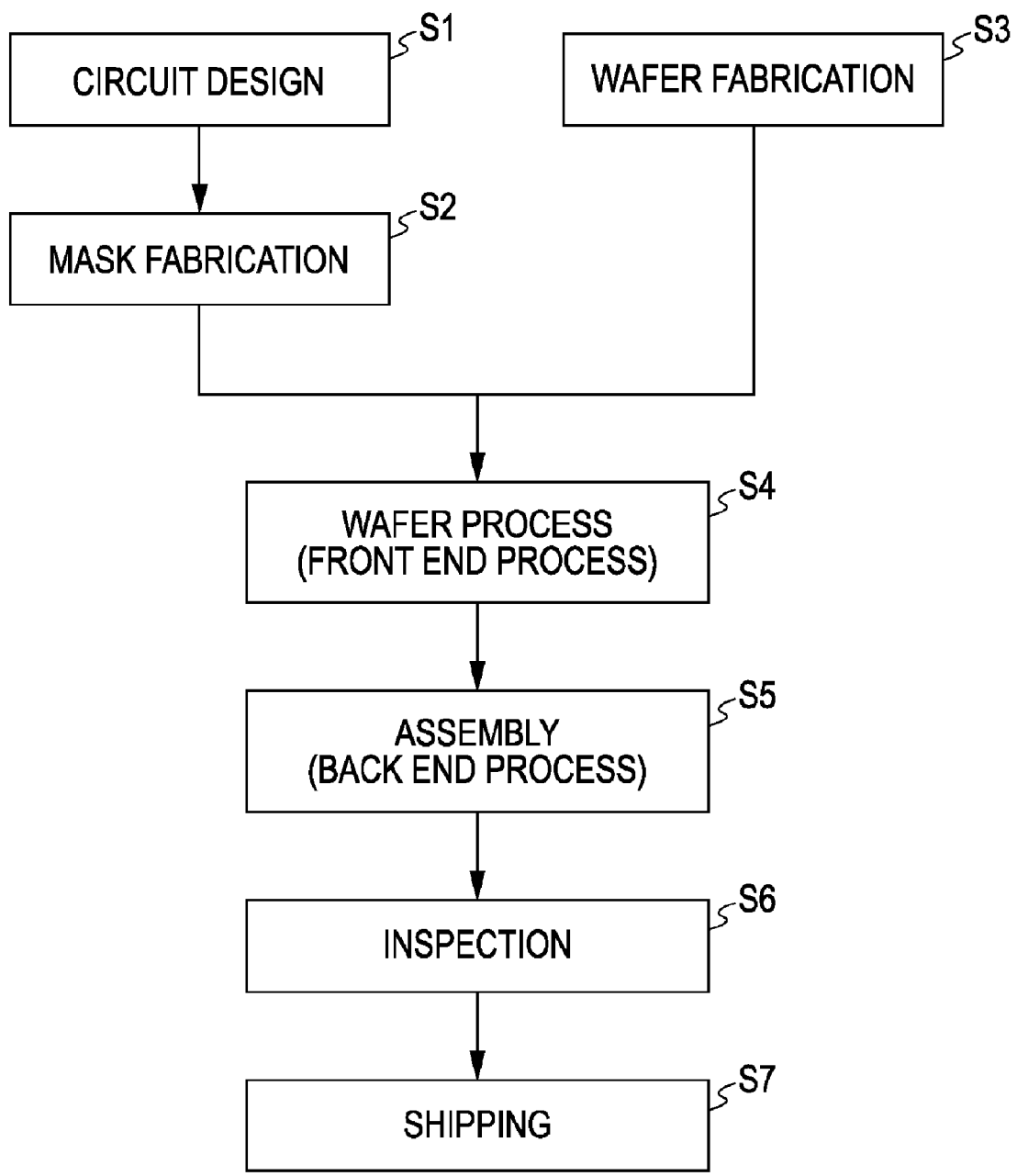
FIG. 13 is a flowchart of a semiconductor-device manufacturing process.

FIG. 13 is a flowchart showing a manufacturing procedure for semiconductor devices (e.g., semiconductor chips such as ICs and LSIs, liquid crystal panels, and CCDs). In Step S1 (circuit design), a circuit pattern of a semiconductor device is designed. In Step S2 (mask fabrication), a mask (reticle R) having the designed circuit pattern is fabricated. In Step S3 (wafer fabrication), a wafer (wafer W) is made (e.g., from silicon). In Step S4 (wafer process) called a front end process, an actual circuit is formed on the wafer by using the prepared mask and wafer by lithography. In Step S5 (assembly) called a back end process, a semiconductor chip is produced by using the wafer fabricated in Step S4. The back end process includes, for example, an assembly step (dicing, bonding) and a packaging step (chip encapsulation). In Step S6 (inspection), the semiconductor chip produced in Step S5 is subjected to various inspections such as an operation confirmation test and a durability test. A semiconductor device is completed through the above steps, and is then shipped (Step S7).

Figure 14:
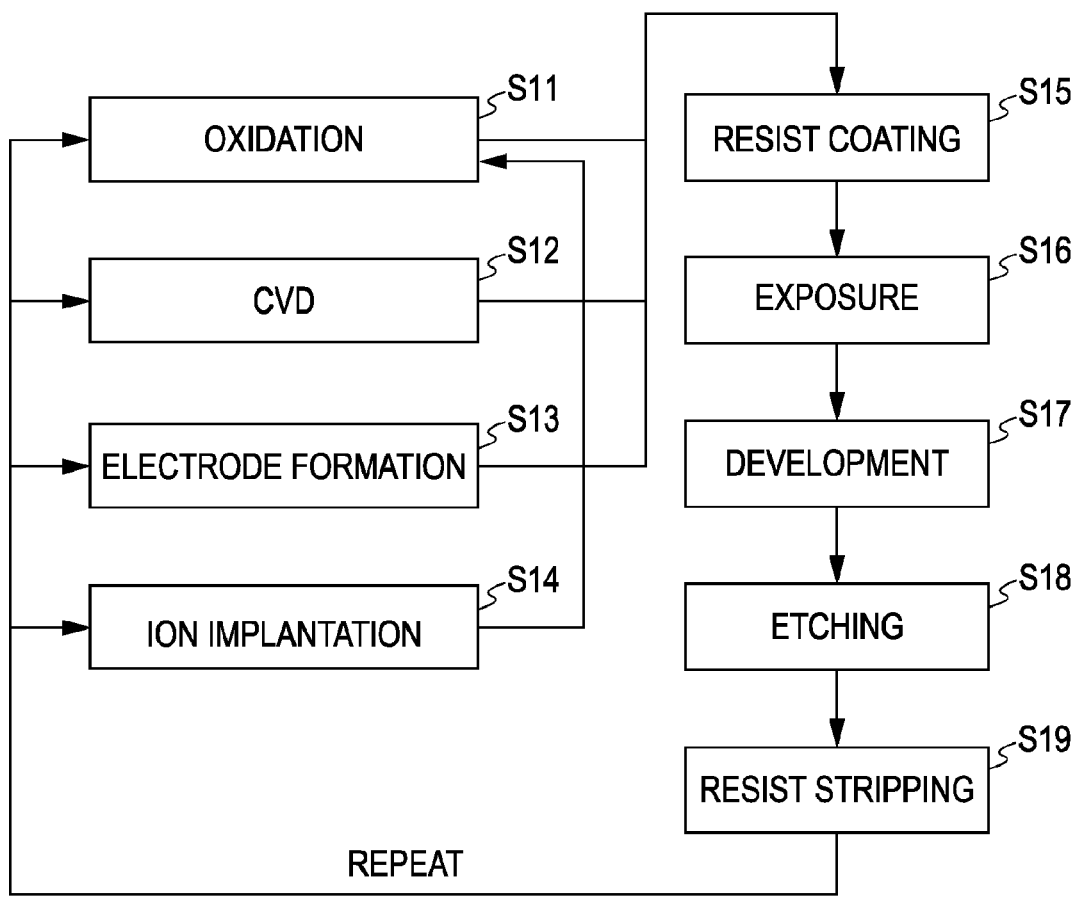
FIG. 14 is a detailed flowchart of a wafer process in the process shown in FIG. 13.

FIG. 14 is a detailed flowchart of the above-described wafer process S4. In Step S11 (oxidation), the surface of the wafer (wafer W) is oxidized. In Step S12 (CVD), an insulating film is formed on the surface of the wafer. In Step S13 (electrode formation), electrodes are formed on the wafer by vapor disposition. In Step S14 (ion implantation), ions are implanted into the wafer. In Step S15 (resist coating), a resist (photosensitive material) is applied on the wafer. In Step S16 (exposure), the circuit pattern of the mask (reticle R) is transferred onto the wafer by exposure with the above-described exposure apparatus. In Step S17 (development), the exposed wafer is developed. In Step S18 (etching), a portion other than the developed resist is removed. In Step S19 (resist stripping), the resist, which has become unnecessary after etching, is removed. By repeating these steps, circuit patterns are formed on the wafer.

The manufacturing method of at least one exemplary embodiment of the present invention can manufacture highly integrated semiconductor devices that have not been obtained before.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-098000 filed Mar. 31, 2006, which is hereby incorporated by reference herein in its entirety.

What is claimed is:

1. A light source comprising:
a plasma generator configured to generate a plasma;
a mirror configured to reflect light that is emitted from the plasma;
a plurality of plates provided between the plasma and the mirror and arranged radially around an optical axis of the mirror; and
a magnetic-field generator configured to generate a magnetic field
wherein the magnetic-field generator includes a plurality of permanent magnets, and
wherein one of the permanent magnets is disposed on the optical axis of the mirror, and the other permanent magnets are arranged radially around the optical axis.

2. An exposure apparatus comprising:
a light source according to claim 1;
an illumination optical system for illuminating a reticle having a pattern with light from the light source; and
a projection optical system for projecting the pattern onto a wafer.

3. A device manufacturing method comprising the steps of:
applying a resist on a wafer;
exposing the wafer with a pattern by an exposure apparatus according to claim 2; and
developing the exposed wafer.

4. A light source comprising:
a plasma generator configured to generate a plasma;
a mirror configured to reflect light that is emitted from the plasma;
a plurality of plates provided between the plasma and the mirror and arranged radially around an optical axis of the mirror; and
a magnetic-field generator configured to generate a magnetic field
wherein at least one plate has an end nearer to the light emission center that has a distance r1 from the light emission center, and the at least one plate has an end the furthest from the light emission center that has a distance r2 from the light emission center, where $\theta$ is the angle between the intersection of at least two plates, where the distance from r2 to r1 has been predetermined so that a chosen radius of curvature R of a target charged particle emitted from the plasma has a radius of curvature R, that satisfies:

$$r1/8 < R < 4\sqrt{r1^2 - r1 r2 \cos\theta + r_2^2/4}.$$

5. A light source comprising:
a plasma generator configured to generate a plasma;
a mirror configured to reflect light that is emitted from the plasma;
a plurality of plates provided between the plasma and the mirror and arranged radially around an optical axis of the mirror; and
a magnetic-field generator configured to generate a magnetic field
wherein at least one plate has an end nearer to the light emission center that has a distance r1 from the light emission center, and the at least one plate has an end the furthest from the light emission center that has a distance r2 from the light emission center, where $\theta$ is the angle between the intersection of at least two plates, where the distance from r2 to r1 has been predetermined so that a chosen radius of curvature R of a target charged particle emitted from the plasma has a radius of curvature R, that satisfies:

$$(1 - \cos\theta) r1/4 \sin\theta < R < 2(r1^2 + r2^2 - 2{,}1 r2 \cos\theta)/r2 \sin\theta.$$

6. A light source comprising:
a plasma generator configured to generate a plasma;
a mirror configured to reflect light that is emitted from the plasma;
a plurality of plates provided between the plasma and the mirror and arranged radially around an axis perpendicular to an optical axis of the mirror; and
a magnetic-field generator configured to generate a magnetic field,
wherein the magnetic-field generator apply the magnetic field parallel to the axis perpendicular to the optical axis of the mirror.

7. The light source according to claim 6, wherein the magnetic-field generator includes a pair of permanent magnets opposing each other along the axis perpendicular to the optical axis of the mirror.

* * * * *